(12) United States Patent
Choi et al.

(10) Patent No.: US 8,507,301 B2
(45) Date of Patent: Aug. 13, 2013

(54) TFT ARRAY SUBSTRATE AND THE FABRICATION METHOD THEREOF

(75) Inventors: Young Seok Choi, Gumi-si (KR); Hong Woo Yu, Gumi-si (KR); Ki Sul Cho, Gumi-si (KR); Jae Ow Lee, Ahndong-si (KR); Bo Kyoung Jung, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 730 days.

(21) Appl. No.: 12/591,657

(22) Filed: Nov. 25, 2009

(65) Prior Publication Data

US 2010/0075472 A1 Mar. 25, 2010

Related U.S. Application Data

(62) Division of application No. 11/289,503, filed on Nov. 30, 2005, now Pat. No. 7,646,018.

(30) Foreign Application Priority Data

Dec. 30, 2004 (KR) .............................. 117242/2004

(51) Int. Cl.
*H01L 21/00* (2006.01)
(52) U.S. Cl.
USPC ............. 438/30; 438/149; 438/152; 438/158; 257/E21.415
(58) Field of Classification Search
USPC ... 438/149, 30, 152, 158, 155; 257/E21.415, 257/155
See application file for complete search history.

(56) References Cited

U.S. PATENT DOCUMENTS

| | | | |
|---|---|---|---|
| 6,188,452 B1 * | 2/2001 | Kim et al. | 349/43 |
| 6,518,630 B2 * | 2/2003 | You et al. | 257/380 |
| 2001/0010370 A1 | 8/2001 | Kimura et al. | |
| 2002/0130324 A1 * | 9/2002 | Song et al. | 257/72 |
| 2002/0171108 A1 | 11/2002 | Lim et al. | |
| 2004/0036070 A1 | 2/2004 | Yun | |

FOREIGN PATENT DOCUMENTS

| | | |
|---|---|---|
| DE | 10150432 | 5/2002 |
| JP | 62-252964 | 11/1987 |
| JP | 08-234227 | 9/1996 |
| JP | 09-015623 | 1/1997 |
| JP | 11-274505 | 10/1999 |
| JP | 11-307780 | 11/1999 |
| JP | 2000-002892 | 1/2000 |
| JP | 2000-164886 | 6/2000 |
| KR | 10-2002-0012795 | 2/2002 |
| KR | 10-2003-0082647 | 10/2003 |
| KR | 10-2004-0050236 | 6/2004 |

* cited by examiner

*Primary Examiner* — Michael Trinh
(74) *Attorney, Agent, or Firm* — McKenna Long & Aldridge, LLP

(57) ABSTRACT

A TFT array substrate includes: a gate electrode connected to a gate line; a source electrode connected to a data line crossing the gate line to define a pixel region; a drain electrode which is opposite to the source electrode with a channel in between; a semiconductor layer defining the channel between the source electrode and the drain electrode; a pixel electrode in the pixel region and connected to the drain electrode; a channel passivation layer on the channel of the semiconductor layer; a gate pad extending from the gate line, where a semiconductor pattern and a transparent conductive pattern are formed; a data pad connected to the data line, where the transparent conductive pattern is formed; and a gate insulating layer formed under the semiconductor layer, the gate line and the gate pad, and the data line and the data pad.

12 Claims, 11 Drawing Sheets

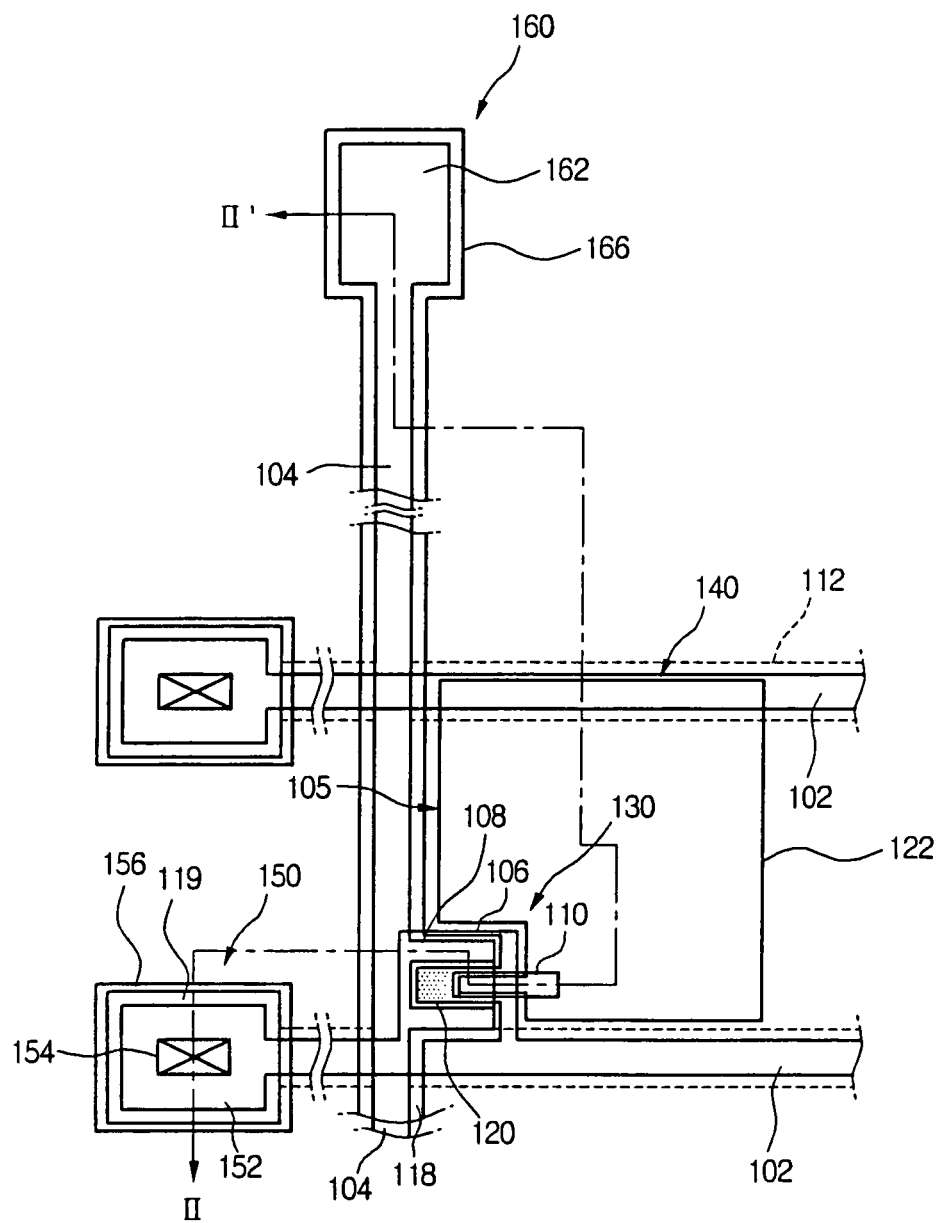

TFT ARRAY SUBSTRATE AND THE FABRICATION METHOD THEREOF

This application is a divisional application of U.S. patent application Ser. No. 11/289,503, filed on Nov. 30, 2005 now U.S. Pat. No. 7,646,018, which claims the benefit of Korean Patent Application No. 117242/2004, filed on Dec. 30, 2004, all of which are hereby incorporated by reference for all purposes as if fully set forth herein.

BACKGROUND OF THE INVENTION

1. Field of the Invention

The present invention relates to a thin film transistor (TFT) array substrate, and more particularly, to a TFT array substrate capable of preventing pad corrosion as well as protecting a TFT without any passivation layer, and the fabrication method thereof.

2. Discussion of the Related Art

A liquid crystal display device (LCD) displays an image by controlling the light transmittance of liquid crystal (LC) using an electric field.

The LCD drives liquid crystal using an electric field formed between a pixel electrode and a common electrode respectively disposed on an upper substrate and a lower substrate facing each other.

The LCD has a TFT array substrate (lower array substrate) and a color filter array substrate (upper array substrate) facing each other, a spacer disposed between the two array substrates to maintain a cell gap, and liquid crystal filling the cell gap.

The TFT array substrate includes signal lines, TFTs, and an alignment layer coated thereon to align the LC.

The color filter array substrate includes a color filter for reproducing colors, a black matrix (BM) for preventing light leakage, and an alignment layer coated thereon for aligning the LC.

In the LCD, as the TFT array substrate requires a semiconductor process and a plurality of mask processes, the manufacturing process thereof is complicated and thus the manufacturing cost increases.

To solve this problem, it is desired to develop a TFT array substrate that reduces the number of mask processes.

The reason for this is that one mask process may include many processes such as a thin film deposition process, a cleaning process, a photolithography process, an etching process, a photoresist stripping process, and an inspection process.

Recently, a 4-mask process requiring one less mask process than a standard 5-mask process that was typical for a TFT array substrate has been developed.

FIG. 1 is a plan view of a related art TFT array substrate fabricated using a 4-mask process, and FIG. 2 is a sectional view taken along line I-I' in FIG. 1.

Referring to FIGS. 1 and 2, the related art TFT array substrate of a liquid crystal panel includes a lower substrate 1, a gate line 2, and a data line 4 formed on the lower substrate crossing each other with a gate insulating layer 12 in between, a TFT 30 formed at each crossing, a pixel electrode 22 formed in a pixel region defined by the crossing gate and data lines, a storage capacitor 40 formed at an overlapping area of the gate line 2 and a storage electrode 28, a gate pad 50 connected to the gate line 2, and a data pad 60 connected to the data line 4.

The gate line 2 supplying a gate signal and the data line 4 supplying a data signal are formed in a crossing structure to define a pixel region 5.

The TFT 30 allows a pixel signal on the data line 4 to be charged and maintained at the pixel electrode 22 in response to the gate signal of the gate line. The TFT 30 includes a gate electrode 6 connected to the gate line 2, a source electrode 8 connected to the data line 4, and a drain electrode 10 connected to the pixel electrode 22.

The TFT 30 further includes an active layer 14 that overlaps the gate electrode 6 with the gate insulating layer 12 between, to form a channel in between the source electrode 8 and the drain electrode 10.

The active layer 14 overlaps the data line 4, a data pad lower electrode 62, and the storage electrode 28.

An ohmic contact layer is further formed on the active layer 14 that provides 16 an ohmic contact with the data line 4, the source electrode 8, the drain electrode 10, the data pad lower electrode 62, and the storage electrode 28.

The pixel electrode 22 is formed in the pixel region 5 and connected to the drain electrode 10 of the TFT 30 through a first contact hole 20 that penetrates a passivation layer 18.

An electric field is formed between the pixel electrode 22 to which a pixel signal is applied through the TFT 30 and a common electrode (not shown) to which a reference voltage is applied. Liquid crystal molecules between the lower array substrate and an upper array substrate are rotated due to dielectric anisotropy by the electric field.

The light transmittance of the pixel region 5 is changed according to the rotational degree of the liquid crystal molecules, so that a gray scale is realized.

The storage capacitor 40 includes the gate line 2 and a storage electrode 28 that overlaps the gate line 2 with the gate insulating layer 12, the active layer 14, and the ohmic contact layer 16 in between.

The storage electrode 28 is connected to the pixel electrode 22 through a second contact hole 42 formed in the passivation layer 18.

The storage capacitor 40 allows a pixel signal charged on the pixel electrode 22 to be stably maintained until a next pixel signal is charged.

The gate pad 50 is connected to a gate driver (not shown) to apply a gate signal to the gate line 2. The gate pad 50 includes a gate pad lower electrode 52 extending from the gate line 2 and a gate pad upper electrode 54 connected to the gate pad lower electrode 52 through a third contact hole 56 that penetrates the gate insulating layer 12 and the passivation layer 18.

The data pad 60 is connected to a data driver (not shown) to apply a data signal to the data line 4. The data pad 60 includes a data pad lower electrode 62 extending from the data line 4 and a data pad upper electrode 64 connected to the data pad lower electrode 62 through a fourth contact hole 66 that penetrates the passivation layer 18.

A method of fabricating a TFT array substrate of a liquid crystal panel using a 4-mask process will be described in detail with reference to FIGS. 3A to 3D.

Referring to FIG. 3A, a first conductive pattern group including a gate line 2, a gate electrode 6, and a gate pad lower electrode 52 is formed on a lower substrate 1 using a first mask process.

A gate metal layer is formed on the lower substrate 1 using a deposition method (e.g., a sputtering method).

Then, the gate metal layer is patterned by a photolithography process and an etching process that use a first mask, so that the first conductive pattern group including the gate line 2, the gate electrode 6, and the gate pad lower electrode 52 is formed.

Referring to FIG. 3B, a gate insulating layer 12 is coated on the lower substrate 1 on which the gate pattern is formed.

Thereafter, a semiconductor pattern including an active layer 14 and an ohmic contact layer 16; and a second conductive pattern group including, a data line 4, a source electrode 8, a drain electrode 10, and a data pad lower electrode 62, and a storage electrode 28 are formed on the gate insulating layer 12 using a second mask process.

Referring to FIG. 3C, a passivation layer 18 including first to fourth contact holes 20, 42, 56 and 66 is formed by a second mask process on the gate insulating layer 12 on which the second conductive pattern group is formed. The passivation layer 18 is formed by a deposition method (e.g., a plasma enhanced chemical vapor deposition (PECVD)) on the entire surface of the gate insulating layer 12 on which the data pattern is formed.

Thereafter, the passivation layer 18 is patterned through a photolithography process and an etching process that use a third mask, so that the first to fourth contact holes 20, 42, 56, and 66 are formed.

The first contact hole 20 penetrates the passivation layer 18 to expose the drain electrode 10, and the second contact hole 42 penetrates the passivation layer 18 to expose the storage electrode 28.

The third contact hole 56 penetrates the passivation layer 18 and the gate insulating layer 12 to expose the gate pad lower electrode 52, and the fourth contact hole 66 penetrates the passivation layer 18 to expose the data pad lower electrode 62.

Referring to FIG. 3D, a third conductive pattern group including a pixel electrode 22, a gate pad upper electrode 54, and a data pad upper electrode 64 is formed on the passivation layer 18 using a fourth mask process.

The related art TFT array substrate has the passivation layer 18 to protect the TFT 30.

The passivation layer 18 is formed by depositing inorganic insulation material using a PECVD apparatus, or coating an organic insulation material using a spin coating apparatus or a spinless coating apparatus.

Because the PECVD apparatus, the spin coating apparatus, or the spinless coating apparatus are required to form the passivation layer 18 as descried above, the manufacturing cost increases.

Also, because the data line 4 is formed using a single layer, it is frequently opened. In this case, a separate process is required to repair the opened data line 4.

Also, when the passivation layer 18 is formed of an organic insulation material, the pixel electrode 22 may be disconnected due to the relatively thick passivation layer 18.

Particularly, the pixel electrode 22 is disconnected at the side of the passivation layer 18 exposed by the contact hole 20 for allowing the drain electrode 10 to contact with the pixel electrode 22.

Accordingly, because a pixel signal is not applied to the pixel electrode 22 through the drain electrode 10, a point defect is generated.

Also, the storage capacitor 40 includes the gate line 2 and the storage electrode 28 that overlap each other with the gate insulating layer 12, the active layer 14, and the ohmic contact layer 16 in between.

In this case, the capacitance of the storage capacitor 40 is degraded by the relatively thick gate insulating layer 12 that insulates the gate line 2 from the storage electrode 28, the active layer 14, and the ohmic contact layer 16.

Also, image quality degradation (e.g., spots) results due to the relatively low capacitance of the storage capacitor 40.

Also, because the data pad is opened when the passivation layer is formed, a defect (e.g., galvanic corrosion of a data pad) may be generated during a subsequent process.

SUMMARY OF THE INVENTION

Accordingly, the present invention is directed to a TFT array substrate and the fabrication method thereof that substantially obviates one or more problems due to limitations and disadvantages of the related art.

An advantage of the present invention is to provide a TFT array substrate and the fabrication method thereof, capable of protecting a TFT without any passivation layer and further reducing cost of fabrication.

Another advantage of the present invention is to provide a TFT array substrate and the fabrication method thereof, capable of reducing the number of mask processes by using a diffraction mask and also capable of reducing defects by having a redundant transparent conductive layer overlapping the data line.

A further another advantage of the present invention is to provide a TFT array substrate and the fabrication method thereof, capable of preventing corrosion that incurs when the data pad becomes opened by using a jumping structure of a gate metal pattern and a data metal pattern.

A still further another advantage of the present invention is to provide a TFT array substrate and the fabrication method thereof, capable of reducing the number of fabrication process steps and enhancing the production yield by forming an electrostatic protection structure separating even and odd data lines.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a thin film transistor (TFT) array substrate, including: a gate electrode connected to a gate line; a source electrode connected to a data line crossing the gate line to define a pixel region; a drain electrode which is opposite to the source electrode with a channel in between; a semiconductor layer defining the channel between the source electrode and the drain electrode; a pixel electrode in the pixel region and connected to the drain electrode; a channel passivation layer on the channel of the semiconductor layer; a gate pad extending from the gate line, where a semiconductor pattern and a transparent conductive pattern are formed; a data pad connected to the data line, where the transparent conductive pattern is formed; and a gate insulating layer formed under the semiconductor layer, the gate line and the gate pad, and the data line and the data pad.

In another aspect of the present invention, there is provided a method for fabricating a TFT array substrate, including: forming a gate electrode, a gate line and a gate pad on a substrate; forming a gate insulating layer, a semiconductor layer, and a metal layer on the gate electrode; patterning the gate insulating layer, the semiconductor layer and the metal layer so as to form the gate line, the data line, a TFT region, the gate pad, and the data pad; and coating and patterning a transparent conductive layer on the substrate to form source and drain electrodes, a semiconductor layer defining a channel therebetween, a channel passivation layer formed on the semiconductor layer, a pixel electrode connected to the drain electrode formed in the TFT region, and upper electrodes of the gate pad and the data pad.

In a further another aspect of the present invention, there is provided a TFT array substrate including: a gate electrode connected to a gate line; a source electrode connected to a data line crossing the gate line to define a pixel region; a drain electrode which is opposite to the source electrode with a channel in between; a semiconductor layer defining the channel in between the source electrode and the drain electrode; a pixel electrode formed at the pixel region, directly connected to the drain electrode; a channel passivation layer formed at a predetermined location corresponding to the channel of the semiconductor layer to protect the semiconductor layer defining the channel; a gate pad extended from the gate line where a semiconductor pattern and a transparent conductive pattern are formed; a data pad connected to the data line where the transparent conductive pattern is formed; even/odd data lines that apply signals to the data pad; an electrostatic passivation line pattern connected to one of the even and odd data lines, arranged to be separated by a predetermined distance; and an outer shorting bar connected to each of one of the even and odd data lines.

In a still further another aspect of the present invention, there is provided a method for forming a TFT array substrate, including: forming a gate electrode, a gate line, a gate pad, a data pad, and a first shorting bar on a substrate; forming a gate insulating layer, a semiconductor layer, and a metal layer on the gate electrode; patterning the gate insulating layer, the semiconductor layer, and the metal layer so as to form the gate line, the data line, a TFT region, the gate pad, the data pad, and a second shorting bar; and coating and patterning a transparent conductive layer on the substrate to form source and drain electrodes, a semiconductor layer defining a channel therebetween with a channel passivation layer formed on the semiconductor layer and a pixel electrode connected to the drain electrode in the TFT region, upper electrodes of the gate pad and the data pad, and a jumping electrode connecting the data line to the data pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention. In the drawings:

FIGS. 8A and 8B are a plan view and a sectional view illustrating a method of fabricating a third conductive pattern group in the TFT array substrate according to the present invention;

DETAILED DESCRIPTION OF THE ILLUSTRATED EMBODIMENT

Reference will now be made in detail to an embodiment of the present invention, example of which is illustrated in the accompanying drawings. Wherever possible, the same reference numbers will be used throughout the drawings to refer to the same or like parts.

Figure 1:
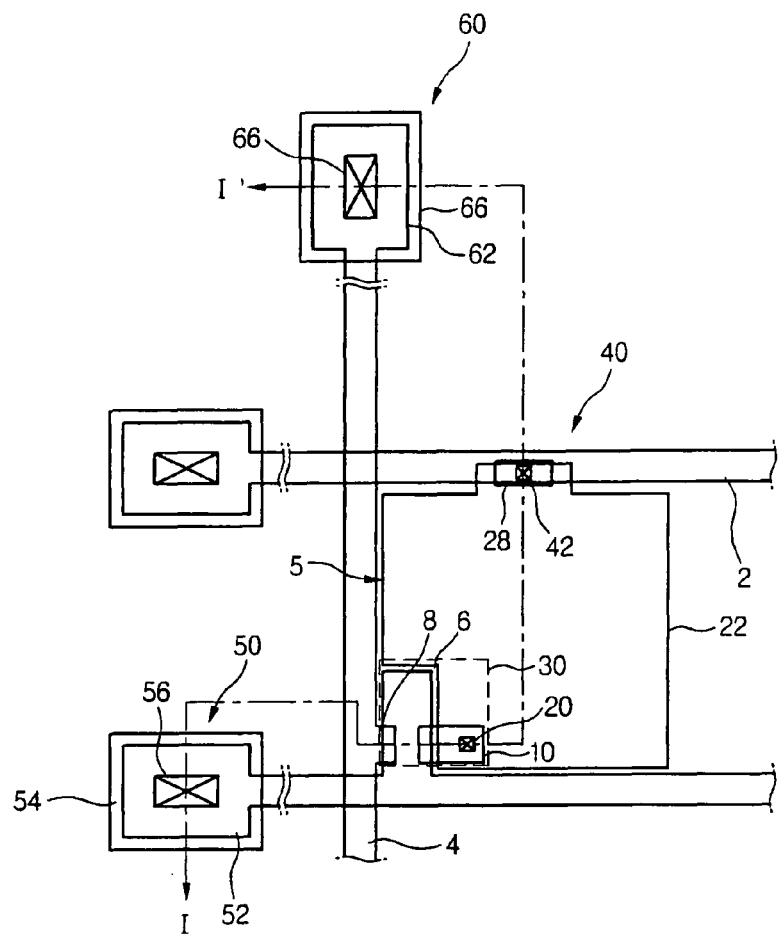
FIG. 1 is a plan view of a thin film transistor (TFT) array substrate using a related art four mask process.
Figure 2:
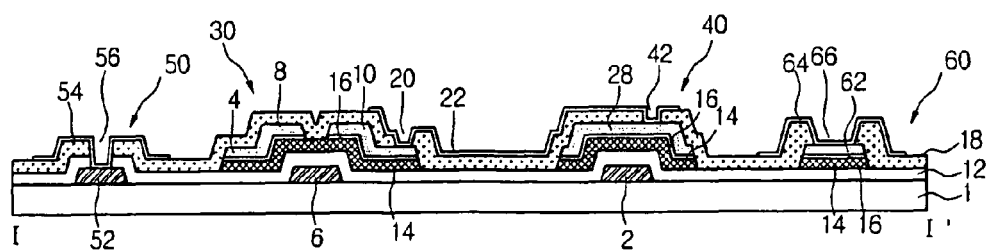
FIG. 2 is a sectional view of the TFT array substrate taken along the line I-I' of FIG. 1.
Figure 3A:
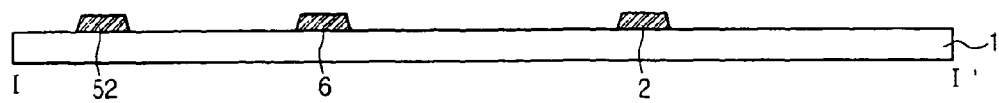
FIG. 3A to 3D are a sectional views illustrating a method for fabricating the TFT array substrate of a related art liquid crystal display panel.
Figure 3B:
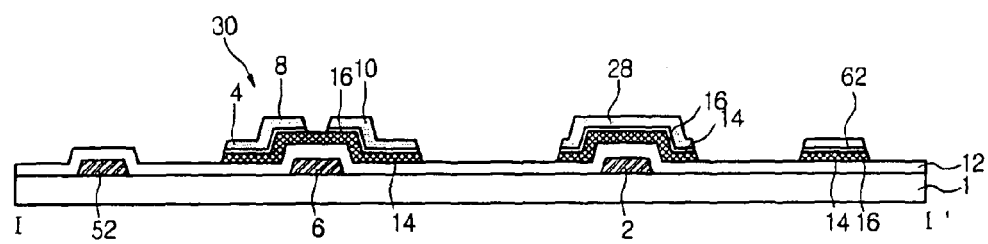
Figure 3C:
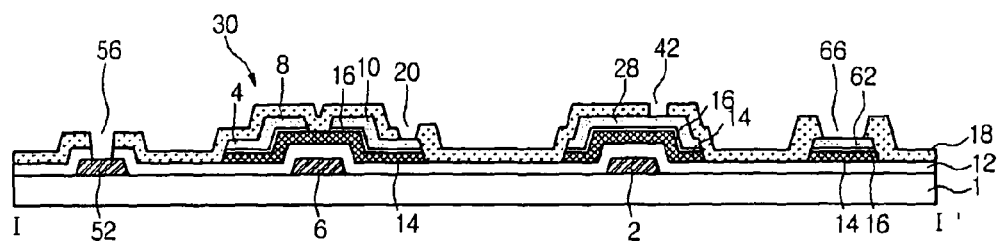
Figure 3D:
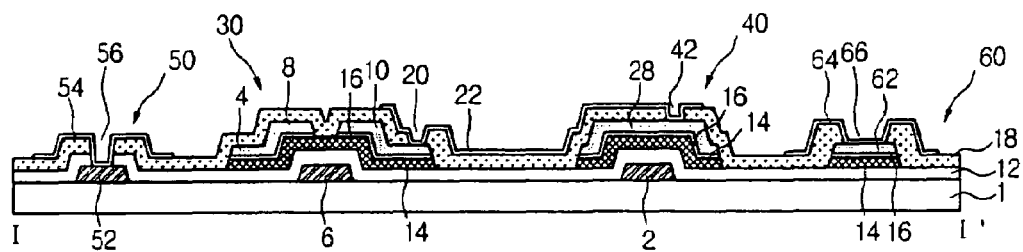
Figure 4:
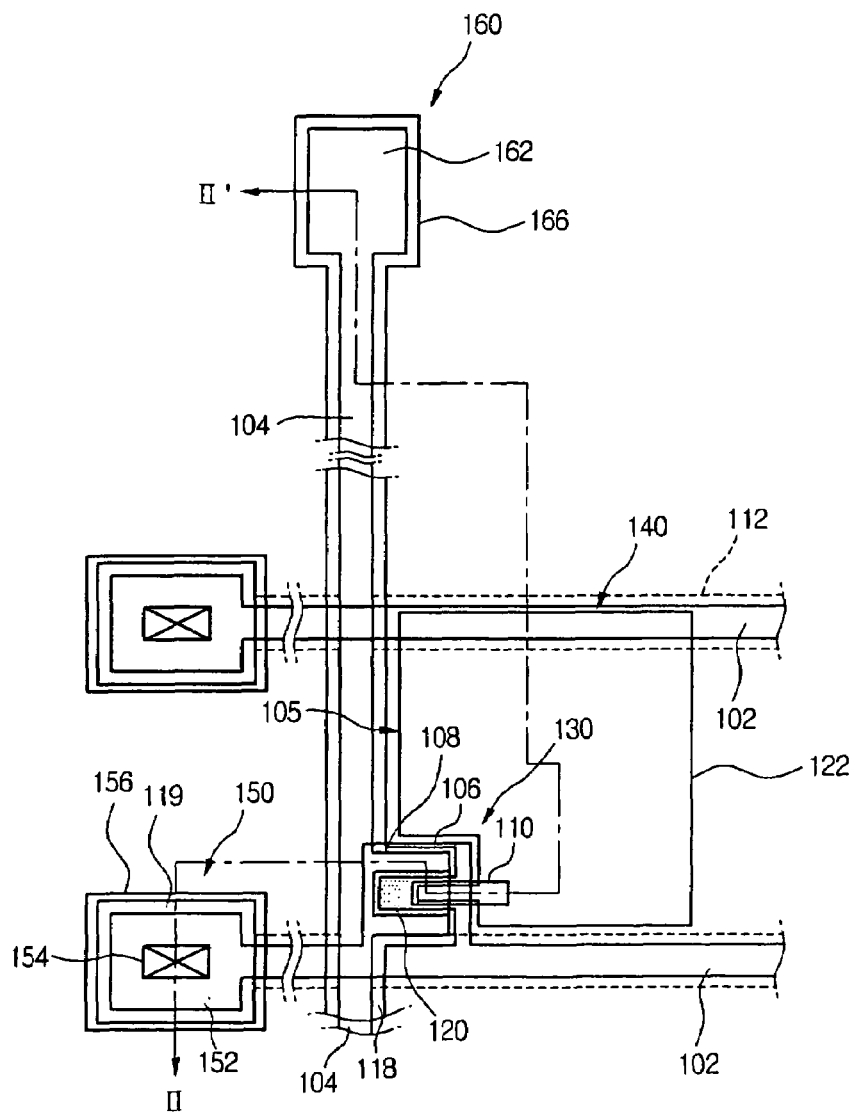
FIG. 4 is a plan view of a TFT array substrate according to the present invention.
Figure 5:
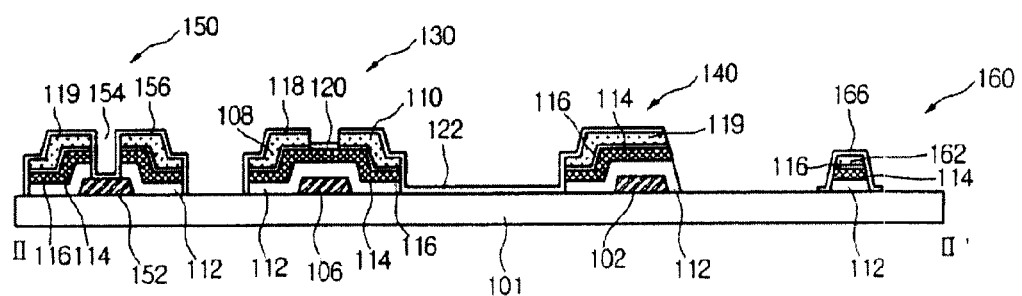
FIG. 5 is a sectional view taken along line II-II' of FIG. 4.

FIG. 4 is a plan view of a thin film transistor (TFT) array substrate according to an embodiment of the present invention, and FIG. 5 is a sectional view taken along line II-II' of FIG. 4.

Referring to FIGS. 4 and 5, a TFT array substrate according to the present invention includes a gate insulating layer 112 formed on a lower substrate 101, a TFT 130 formed at every crossing, a pixel electrode 122 formed in a pixel region defined by the crossing structure and a channel passivation layer 120 that protects the TFT 130.

In addition, the TFT array substrate further includes a storage capacitor 140 formed where gate line 102 overlaps the pixel electrode 122, a gate pad 150 connected to the gate line 102, and a data pad 160 connected to a data line 104.

The gate line 102 applying a gate signal and the data line 104 applying a data signal so as to define a pixel region 105.

The TFT 130 applies a pixel signal on the data line 104 to the pixel electrode 122 in response to the gate signal of the gate line 102.

The TFT 130 has a gate electrode 106 connected to the gate line 102, a source electrode 108 connected to the data line 104, and a drain electrode connected to the pixel electrode 122, Furthermore, the TFT 130 has an active layer 114 forming a channel between the source electrode 108 and the drain electrode 110, wherein the active layer 114 overlaps the underlying gate insulating layer 112 and the gate electrode 106.

The active layer 114 also overlaps the data line 104 and the data pad lower electrode 162.

An ohmic contact layer 116 is formed on the active layer 114 for ohmic contact. The active layer 114 is formed under the data line 104, the source electrode 108, the drain electrode 110, and the data pad lower electrode 162.

The channel passivation layer 120 is formed at a predetermined location of the active layer 114 defining the channel between the source electrode 108 and the drain electrode 110, wherein the channel passivation layer 120 is formed of silicon oxide (SiOx) or silicon nitride (SiNx).

The channel passivation layer 120 plays a role in protecting from damage to the active layer 114 in which the channel is formed.

The pixel electrode 122 is connected to the drain electrode of the TFT 130 and it is formed in the pixel region 105. A transparent conductive pattern 118 is formed on the source electrode 108, the drain electrode 110, and the data line 104, in which the transparent conductive pattern 118 is formed of the same material used for the pixel electrode 122.

The transparent conductive pattern 118 formed on the data line 104 serves as a repair line that applies the data signal to the source electrode 108 of each TFT 130 when the data line 104 is opened.

The transparent conductive pattern 118 formed on the source and drain electrodes 108 and 110 plays a role in protecting the source and drain electrodes 108 and 110 from corrosion, wherein the source and drain electrodes 108 and 110 are formed of a metal which is likely to be eroded such as molybdenum (Mo). Such a transparent conductive pattern 118 should be separated enough to prevent an electric short between adjacent transparent conductive patterns 118 or adjacent pixel electrodes 122.

An electric field is formed between the pixel electrode 122 to which the pixel signal is applied through the TFT 130 and a common electrode (not shown) to which a reference voltage is applied.

Because of this electric field, liquid crystal molecules between the lower array substrate and the upper array substrate are rotated by a dielectric anisotropy.

The transmissivity of the pixel region 105 varies with the degree of rotation of the liquid crystal molecules, to thereby display various grey scales.

Meanwhile, the storage capacitor 140 includes the gate line 102, the active layer 114 on the gate insulating layer 112 overlapped over the gate line 102, the ohmic contact layer 116, a data metal pattern 119 and the pixel electrode 122.

The storage capacitor 140 stably maintains the pixel signal charged on the pixel electrode 122 until a next pixel signal is charged thereon.

The gate pad 150 is connected to a gate driver (not shown) to apply the gate signal to the gate line 102.

The gate pad 150 includes a gate pad lower electrode 152 extending from the gate line 102 and a gate pad upper electrode 156. The gate pad top electrode 156 is formed on the data metal pattern 119 and it is in contact with the gate pad lower electrode 152, the active layer 114 and the ohmic contact layer 116 through a contact hole 154 penetrating the gate insulating layer 112.

The data pad 160 is connected to a data driver (not shown) so as to apply the data signal to the data line 104. The data pad 160 is configured with a data pad lower electrode 162 extending from the data line 104 and a data pad upper electrode 166 formed on the data pad lower electrode 162, wherein the data pad lower electrode 162 is formed after the gate insulating layer 112, the active layer 114, the ohmic contact layer 116 are stacked on the lower substrate in sequence.

Figure 6A:
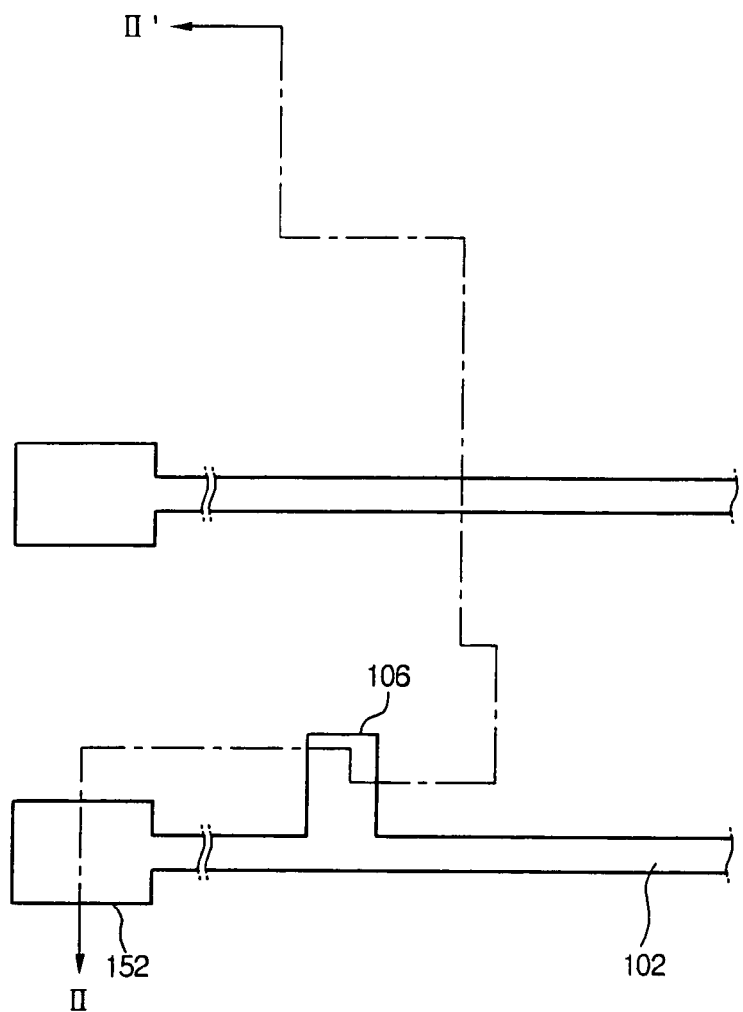
FIGS. 6A and 6B are a plan view and a sectional view illustrating a method for fabricating a first conductive pattern group in the TFT array substrate according to the present invention.
Figure 6B:
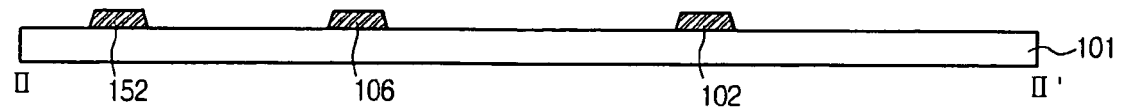

FIGS. 6A and 6B are respectively a plan view and a sectional view illustrating a method for fabricating a first conductive pattern group of the TFT array substrate according to the present invention.

Referring to FIGS. 6A and 6B, the gate line 102, a gate pattern having the gate electrode 106 and the gate pad lower electrode 152 is formed on the lower substrate 101 using a first mask process.

A gate metal layer is formed on the lower substrate 101 through a deposition method such as a sputtering method or the like.

Thereafter, the gate metal layer is patterned into a predetermined configuration by a photolithography process and an etching process using a first mask, to thereby form the gate pattern including the gate line 102, the gate electrode 106, and the gate pad lower electrode 152.

Herein, the gate metal layer employs an aluminum metal or an aluminum composite metal such as aluminum/neodymium (Al/Nd).

Figure 7A:
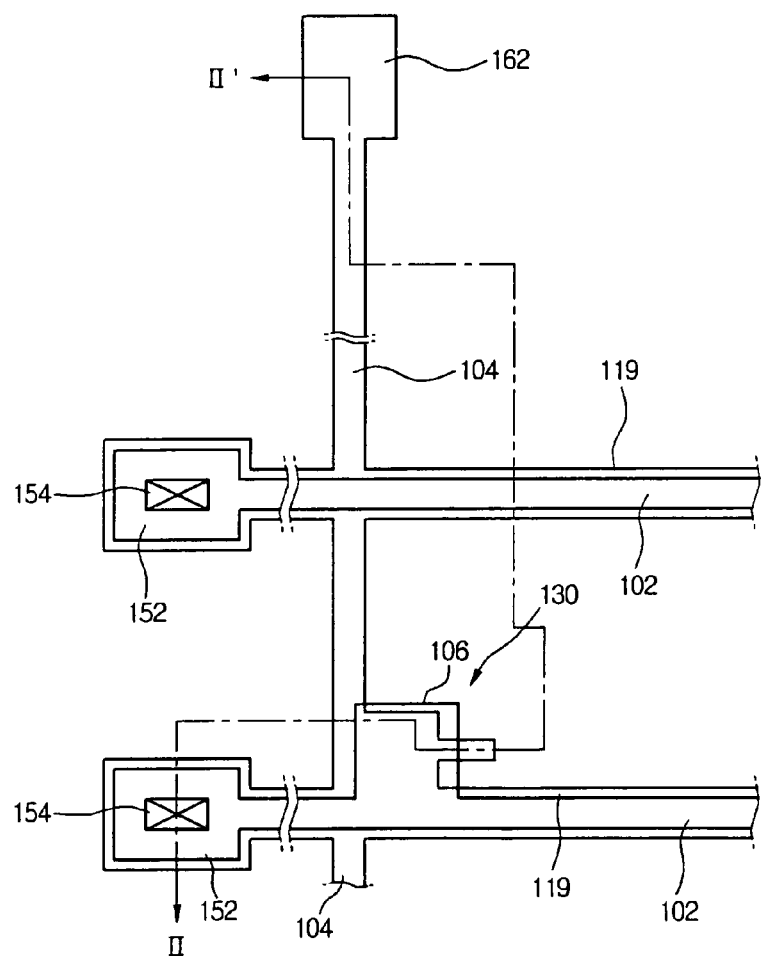
FIGS. 7A and 7B are a plan view and a sectional view illustrating a method for fabricating a semiconductor pattern and a second conductive pattern group in the TFT array substrate according to the present invention.
Figure 7B:
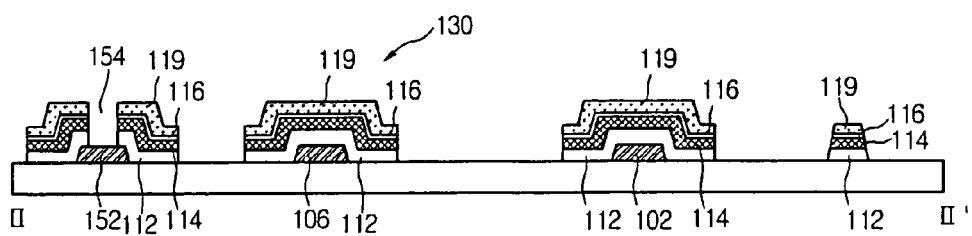

FIGS. 7A and 7B are respectively a plan view and a sectional view illustrating a method of fabricating a second conductive pattern group of the TFT array substrate according to the present invention.

Referring to FIGS. 7A and 7B, the gate insulating layer 112 is coated on the lower substrate 101 on which the first conductive pattern was previously formed.

Upon the gate insulating layer 112, a semiconductor layer and a metal layer are formed.

A semiconductor pattern and a data metal pattern, i.e., the second conductive pattern group, are formed on the gate insulating layer 112, wherein the semiconductor pattern includes the active layer 114 and the ohmic contact layer 116, and the data metal pattern 119 includes the data line 104, the source electrode 108, and the drain electrode 110.

The semiconductor pattern having the active layer 114 and the ohmic contact layer 116, and the data metal pattern are also formed on the gate line 102 and the gate pad 150, thereby preventing corrosion of the gate line 102 which may occur while removing the gate insulating layer 112.

A photoresist layer is formed as a mask on each region of the TFT 130, the storage capacitor 140, the gate pad 150, and the data pad 160. Thereafter, portions of the gate insulating layer 112 which are not covered with the photoresist, are removed.

At the same time, a contact hole 154 is formed in the gate pad 150.

Figure 8B:
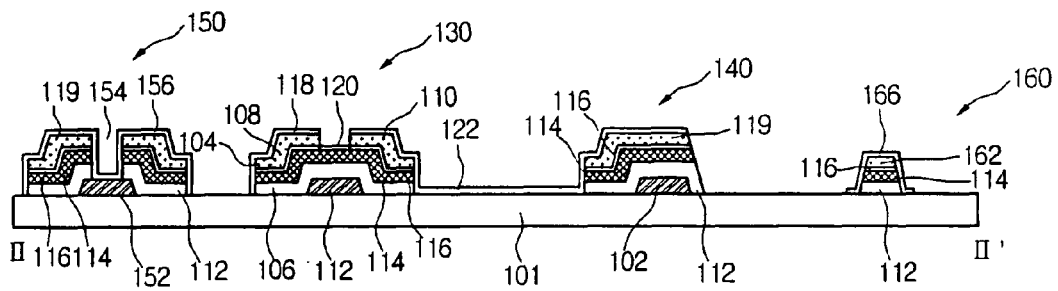

Referring to FIGS. 8A and 8B, a transparent conductive layer is coated on the lower substrate 101 over the first and the second conductive pattern groups. Subsequently, a third conductive pattern group is formed using a third mask process, wherein the third conductive pattern group incorporates the source electrode 108, the drain electrode, the pixel electrode 122 and the transparent conductive pattern 118 in the region of the TFT 130, the gate pad upper electrode 156, and the data pad upper electrode 166.

The transparent conductive layer is coated on the lower substrate 101, on which the contact hole 154 is formed, using a deposition method such as a sputtering method or the like.

The transparent conductive layer may be formed of indium tin oxide (ITO), tin oxide (TO), indium tin zinc oxide (ITZO), or indium zinc oxide (IZO).

Afterwards, the transparent conductive pattern is patterned through a photolithography process and the etching process using a third mask, to thereby form the third conductive pattern group including the pixel electrode 122, the transparent conductive pattern 118, the gate pad upper electrode 156, and the data pad upper electrode 166. The third conductive pattern is also formed on the data line 104 and the source electrode 108.

The pixel electrode 122 is directly connected to the drain electrode 110. The transparent conductive pattern 118 is formed over the data line 104, the source electrode 108, and the drain electrode 110 in order to be directly connected thereto.

The gate pad upper electrode 156 is electrically connected to the gate pad lower electrode 152 through the contact hole 154. The data pad upper electrode 166 is formed over the active layer 114, the ohmic contact layer 116 and the data pad lower electrode 162.

A channel passivation layer 120 upon the active layer 114 defining the channel between the source electrode 108 and the drain electrode 110.

Figure 9A:
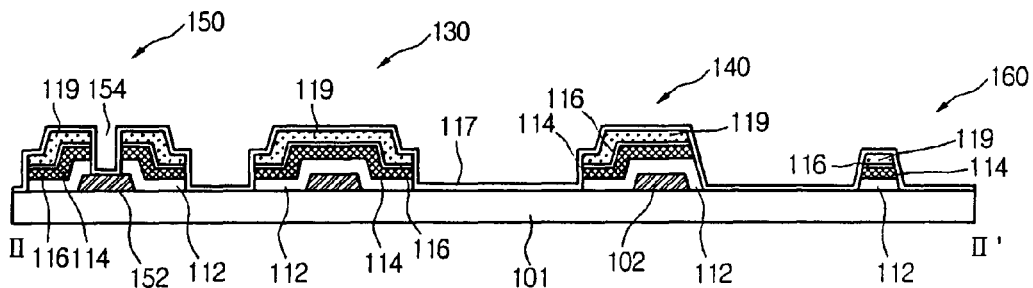
FIGS. 9A and 9E are sectional views illustrating a third mask process in the TFT array substrate according to the present invention.

Descriptions for the photolithography process using the third mask will be illustrated as following. Referring to FIG. 9A, a transparent conductive layer 117 is formed over the lower substrate on which the semiconductor pattern and the second conductive pattern on the gate insulating layer 112 are formed.

Figure 9B:
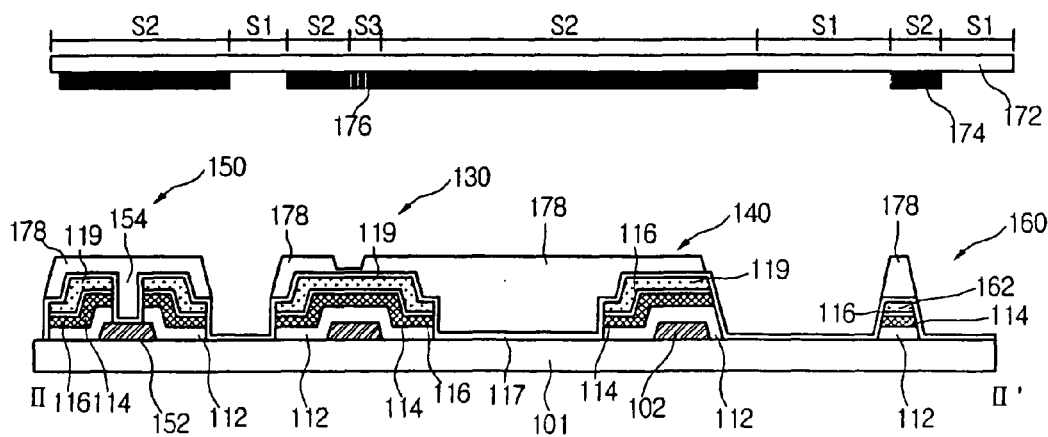

Subsequently, referring to FIG. 9B, the third mask is aligned at a predetermined location over the lower substrate 101 after forming a photoresist layer on the transparent conductive layer 117.

The third mask has a mask substrate 172 of a transparent material, a blocking part 174 formed at a blocking region S2 of the mask substrate 172, and a diffractive exposure part 176 formed at a partial exposure region S3 of the mask substrate 172. Here, a semi-transmissive part may be used instead of the diffractive exposure part 176.

Regions that the mask substrate 172 that are exposed to the light due to the third mask become photo exposure regions.

The photoresist layer is developed after photo exposure using the third mask 170 so as to form a photoresist pattern 178 having predetermined steps thereof between the blocking region S2 and the partial exposure region S3 corresponding to the blocking part 174 and the diffractive exposure part 176 of the third mask 170, respectively.

The photoresist pattern 178 in the TFT region over which the partial exposure region S3 is formed has a second height h2 lower than a first height h1 of the photoresist pattern 178 over which the blocking part S2 is formed.

Figure 9C:
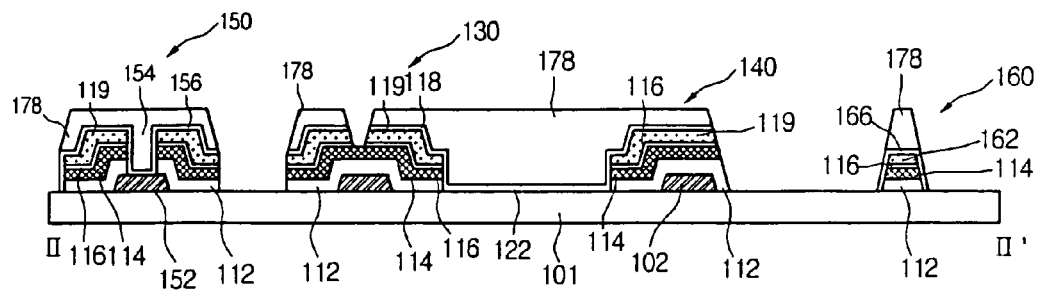

The transparent conductive layer is patterned by a wet etching process using the photoresist pattern 178 as a mask, so as to form the third conductive pattern group as shown in FIG. 9C, wherein the third conductive pattern group includes the source electrode, the drain electrode, the pixel electrode 122, the transparent conductive pattern 118, the gate pad upper electrode 156, and the data pad upper electrode 166.

Thereafter, an ashing process is carried out using oxygen (O2) plasma so that the photoresist pattern 178 having the second height h2 is removed and the height of the photoresist pattern 178 having the first height h1 becomes lower.

Predetermined regions under the diffractive exposure region S3, such as the transparent conductive layer, the data metal pattern 119 and the ohmic contact layer 116 at the channel region of the TFT 130, are removed by the etching process using the photoresist pattern 178. Also, the transparent conductive layer 117, the active layer 114, and the ohmic contact layer 116 formed on the gate line 102 are removed.

Accordingly, the active layer 114 in the channel region is exposed so as to separate the source electrode 108 and the drain electrode 110 from each other.

Figure 9D:
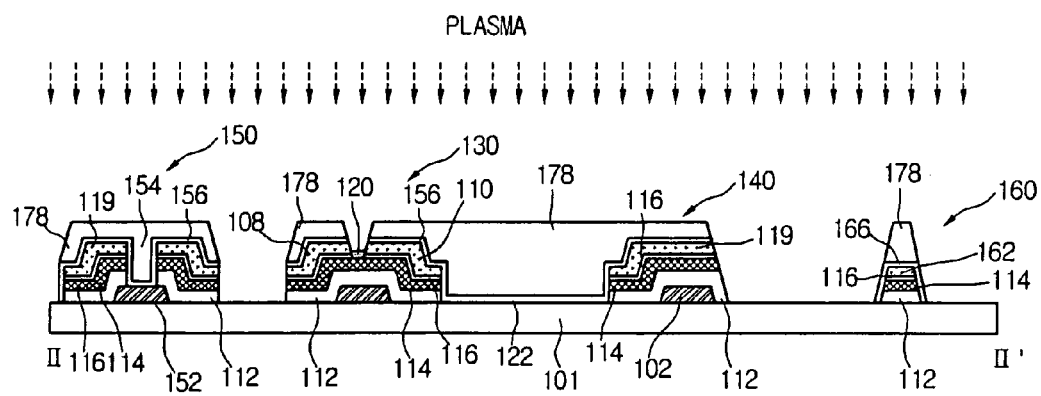

Referring to FIG. 9D, exposed active layer 114 of the channel region is exposed to Ox plasma, e.g., $O_2$ plasma, or Nx plasma, e.g., $N_2$ plasma, using the remanent of the photoresist pattern 178 as the mask.

Then, Ox or Nx which is in an ionic state, reacts with a silicon in the active layer 114, to thereby form the channel passivation layer 120 of $SiO_2$ or $SiN_x$ on the active layer 114 of the channel region.

This channel passivation layer 120 plays a role in protecting the active layer 114 of the channel region from damage.

Figure 9E:
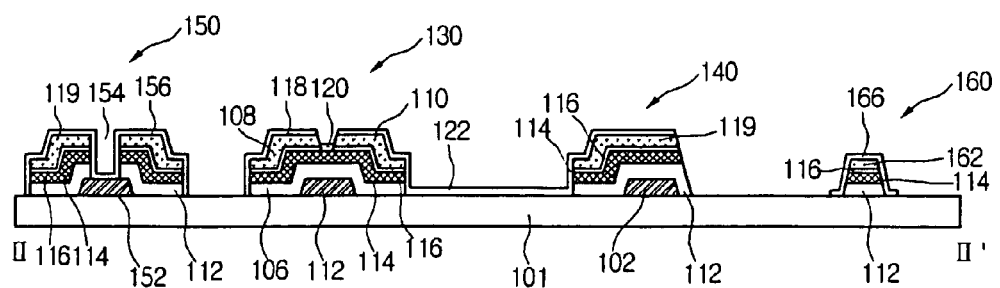

Referring to FIG. 9E, the remaining photoresist pattern 178 on the third conductive pattern group is removed by a stripping-off process.

Figure 10:
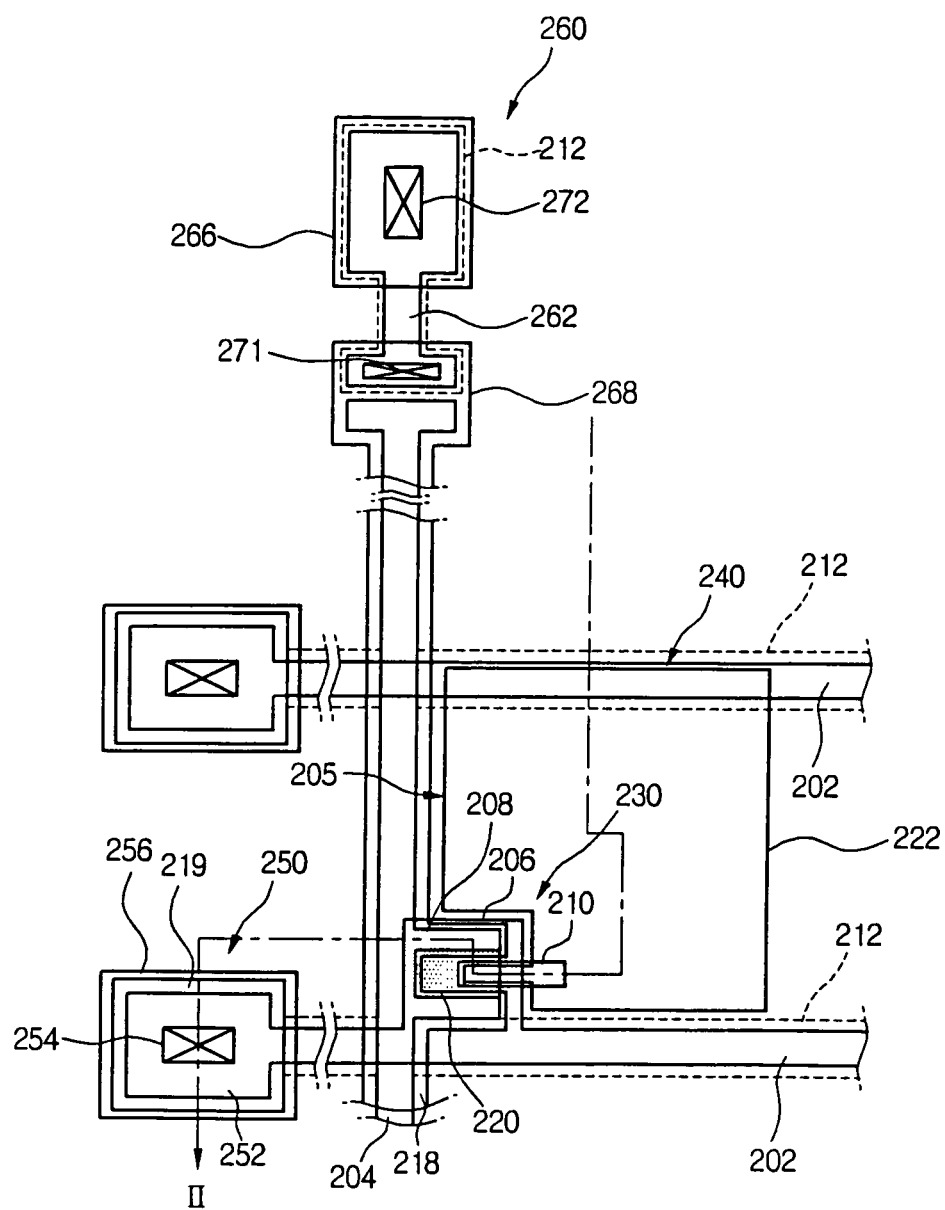
FIG. 10 is a plan view of a TFT array substrate according to another embodiment of the present invention.

FIG. 10 is a plan view of a TFT array substrate according to another embodiment of the present invention.

Explanations for the parts that are same to those shown in FIG. 4 will be omitted.

Referring to FIG. 10, on the TFT array substrate according to the present invention, a data pad 260 includes a data pad lower electrode 262 configured with a gate pattern and a data upper electrode 266 of a transparent conductive layer, wherein the data pad lower electrode 262 extends toward a data line 204 so as to be connected to the data line 204 in a shape of a jumping structure.

The jumping structure connects the data line 204 to the data pad lower electrode 262 by means of the transparent conductive layer, i.e., a jumping electrode 268. Herein, the jumping electrode 268 is connected through contact holes 271 and 272 formed at the data pad lower electrode 262, and may be connected to the transparent conductive pattern formed on the data line 204.

Thus, the data pad 260 configured with the gate pattern is connected to the data line 204 by the jumping structure, while the gate insulating layer is in between.

The TFT array substrate according to the present invention and the color filter array substrate which is opposite to the TFT array substrate are bonded together, to thereby form a liquid crystal panel, wherein the liquid crystal is filled therebetween.

The color filter array substrate is provided with color filters formed at every liquid crystal cell, a black matrix separating the color filters from one another and reflecting external light, and a common node commonly applying a reference voltage to the liquid crystal unit cells.

In particular, the TFT array substrate will be tested using a signal inspection process for detecting line defects such as short, open, or the like, and defects of the TFT after the fabrication process has been completed.

For the signal inspection process, an odd shorting bar and an even shorting bar are prepared on the TFT array substrate, wherein the odd shorting bar and the even shorting bar are connected to odd lines and even line of each of the gate line 202 and the data line 204, respectively.

The inspection of the data lines is carried out to detect line defects using the odd shorting bar 296 commonly connected to the odd data lines 209b and the even shorting bar 297 commonly connected to the even data lines 209a.

Figure 11:
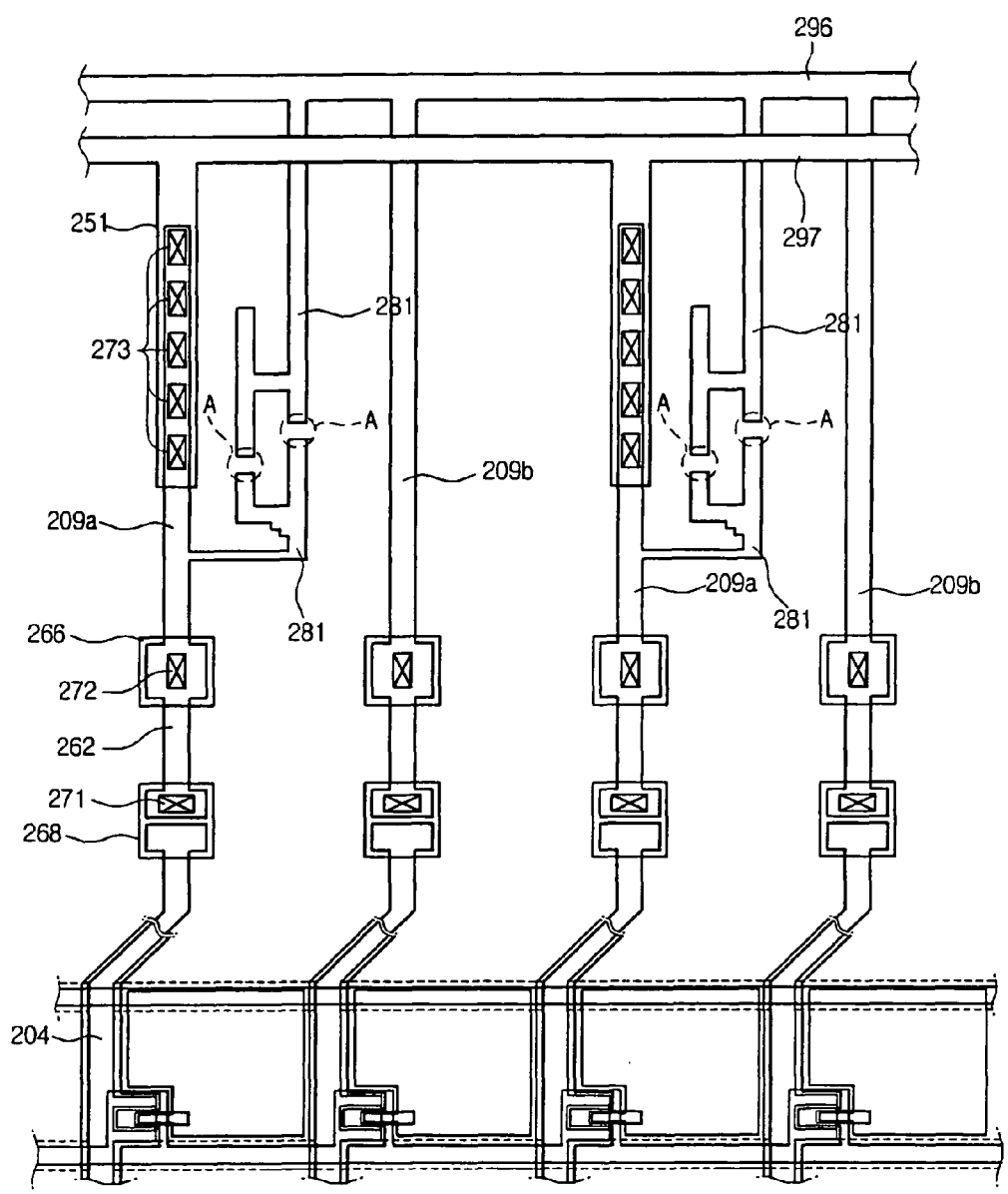
FIG. 11 is a plan view illustrating a predetermined portion of an outer pad of a TFT array substrate according to the present invention.

FIG. 11 is a plan view illustrating a predetermined portion of an outer pad of the TFT array substrate according to the present invention.

Referring to FIGS. 10 and 11, the TFT array substrate according to the present invention includes the TFT transistor 230 formed at every crossing of the gate line 202 and the data line 204, and the pixel electrode 222 connected to the TFT 230. In addition, the data lines 204 pass through external data links so as to form the data pad 260.

The data pad 260 extends to the even/odd data lines 209a and 209b so that it is connected to the shorting bars 296 and 297.

The data pad 260 connected to the data line 204 via the jumping structure and the even/odd data lines 209a and 209b are formed of the gate metal. The even data lines 209a are connected to the data even shorting bar 297 through the data metal pattern 251 and the contact hole 273.

The odd data lines 209b are connected to the odd shorting bars formed of the gate metal.

In order to prevent static electricity, the even data lines 209a are configured with an H-shaped ground line 281, wherein the H-shaped ground line 281 has a predetermined disconnected portion A therein.

The space of the disconnected part A is micrometers in length so that electrostatic current is discharged through the ground lines 281 if static electricity occurs.

The ground line 281 is connected to the data odd shorting bar 296.

The even/odd data lines 209a and 209b have an equipotential by virtue of the ground line 281 to thereby prevent static electricity.

Afterwards, the data even/odd shorting bars 296 and 297 are cut off to be removed while forming the liquid crystal panel.

Because an additional apparatus to form the passivation layer is not required for the TFT array substrate and the fabrication method thereof according to the present invention, it is possible to reduce the fabrication cost. In addition, the present invention is effective to prevent the pixel electrode from being opened at a step portion of the contact hole which exposes the drain electrode.

Furthermore, according to the present invention, it is possible to apply the pixel signal to each TFT without any repair process, when the data line is opened, by using the transparent conductive layer. Moreover, the present invention is effective for preventing the corrosion of the data line, the source electrode and the drain electrode.

Additionally, according to the present invention, it is also possible to reduce defects of image quality such as spots, by increasing the capacitance of the storage capacitor because two adjacent conductors are nearer to each other.

The present invention is also effective for preventing corrosion defects of the data pad.

Furthermore, the even and the odd data lines are separated from each other to form an electrostatic protection architecture in the TFT array substrate according to the present invention so that it is possible to reduce the number of the fabrication process.

Moreover, according to the present invention, it is possible to reduce the number of masks used, to thereby reduce the fabrication cost and simplify the fabrication process.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a TFT array substrate, comprising:
    forming a gate electrode, a gate line and a gate pad on a substrate;
    forming a gate insulating layer, a semiconductor layer and a metal layer on the gate electrode;
    patterning the gate insulating layer, the semiconductor layer and the metal layer so as to form patterns on the gate line, the data line, a TFT region, the gate pad and the data pad;
    coating and patterning a transparent conductive layer on the substrate to form source and drain electrodes, a semiconductor layer defining a channel therebetween, a channel passivation layer formed on the semiconductor layer, a pixel electrode connected to the drain electrode formed in the TFT region, and upper electrodes of the gate pad and the data pad,
    wherein the coating and patterning a transparent conductive layer includes:
    forming a transparent conductive layer on the substrate;
    forming a stepped photoresist pattern in the TFT region using a partial exposure mask;
    forming the source electrode, the drain electrode, the pixel electrode, the gate pad upper electrode and the data pad upper electrode by using the photoresist pattern;
    ashing the photoresist pattern;
    exposing the active layer defining the channel by patterning the metal layer and the ohmic layer corresponding to the channel, using the ashed photoresist pattern;
    forming the channel passivation layer on the exposed active layer by exposing the active layer to a plasma, using the ashed photoresist pattern as a mask; and
    removing the ashed photoresist pattern, and
    further comprising forming a transparent conductive pattern formed on the data line connected to the source electrode, the source electrode and the drain electrode, which is formed of the same material with the pixel electrode,
    wherein the gate pad upper electrode is formed on the data metal pattern, wherein the gate pad upper electrode is formed of the same material as transparent conductive pattern.

2. The method according to claim 1, wherein the forming of the channel passivation region includes forming the channel passivation layer on the active layer by combining silicon in the active layer with one of an oxygen ($O_2$) plasma or nitrogen ($N_2$) plasma.

3. The method according to claim 1, further comprising forming a storage capacitor including the gate line and the pixel electrode overlapped with the gate line, wherein the gate insulating layer is interposed between the gate line and the pixel electrode.

4. The method according to claim 1, wherein the forming of the gate pad includes:
    forming a gate pad lower electrode extended from the gate line connected to the gate line;
    forming a contact hole penetrating the gate insulating layer, the semiconductor pattern and the transparent conductive pattern to expose the gate pad lower electrode; and
    forming a gate pad upper electrode connected to the gate pad lower electrode through the contact hole.

5. The method according to claim 1, further comprising:
    forming a data pad lower electrode connected to the data line through a jumping electrode on the semiconductor layer, wherein the data line is connected to the source electrode; and
    forming a data pad upper electrode connected through a contact hole, wherein the gate insulating layer is disposed under the data pad lower electrode and the data pad upper electrode.

6. The method according to claim 5, wherein the jumping electrode is formed of a transparent conductive material.

7. The method according to claim 1, wherein the data pad and the data line are formed of different materials.

8. The method according to claim 1, further comprising forming an outer shorting bar connected to the data line and applying a signal to the data line.

9. A method for forming a TFT array substrate, comprising:
    forming a gate electrode, a gate line, a gate pad, a data pad and a first shorting bar on a substrate;
    forming a gate insulating layer, a semiconductor layer and a metal layer on the gate electrode;
    patterning the gate insulating layer, the semiconductor layer and the metal layer so as to form patterns on the gate line, the data line, a TFT region, the gate pad, the data pad and a second shorting bar; and
    coating and patterning a transparent conductive layer on the substrate to form source and drain electrodes, a semiconductor layer defining a channel therebetween a channel passivation layer formed on the semiconductor layer and a pixel electrode connected to the drain electrode in the TFT region, upper electrodes of the gate pad and the data pad, and a jumping electrode connecting the data line to the data pad, wherein the gate insulating layer is directly contacted with a lower surface of an active layer, further comprising forming a transparent conductive pattern formed on the data line connected to the source electrode, the source electrode and the drain electrode, which is formed of the same material with the pixel electrode, wherein the gate pad upper electrode is formed on the data metal pattern, wherein the gate pad upper electrode is formed of the same material as transparent conductive pattern.

10. The method according to claim 9, further comprising removing the first and second shorting bars by a cutting process.

11. The method according to claim 9, wherein the data line is connected to an electrostatic protection line pattern so as to form an equipotential therebetween.

12. The method according to claim 11, wherein the electrostatic protection line pattern is connected to the shorting bar.

* * * * *